United States Patent
Yang et al.

(10) Patent No.: US 10,204,998 B2
(45) Date of Patent: *Feb. 12, 2019

(54) HETEROSTRUCTURE DEVICE

(71) Applicant: EPISTAR CORPORATION, Hsinchu (TW)

(72) Inventors: Ya-Yu Yang, Taichung (TW); Ping-Hao Lin, Taichung (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/397,747

(22) Filed: Jan. 4, 2017

(65) Prior Publication Data

US 2017/0117376 A1  Apr. 27, 2017

Related U.S. Application Data

(63) Continuation of application No. 14/864,680, filed on Sep. 24, 2015, now Pat. No. 9,577,048.

(51) Int. Cl.

| | |
|---|---|
| *H01L 21/00* | (2006.01) |
| *H01L 29/47* | (2006.01) |
| *H01L 29/66* | (2006.01) |
| *H01L 21/283* | (2006.01) |
| *H01L 29/20* | (2006.01) |
| *H01L 21/306* | (2006.01) |
| *H01L 29/417* | (2006.01) |
| *H01L 29/778* | (2006.01) |
| *H01L 29/06* | (2006.01) |

(Continued)

(52) U.S. Cl.
CPC .......... *H01L 29/475* (2013.01); *H01L 21/283* (2013.01); *H01L 21/28581* (2013.01); *H01L 21/28593* (2013.01); *H01L 21/30612* (2013.01); *H01L 29/0619* (2013.01); *H01L 29/2003* (2013.01); *H01L 29/205* (2013.01); *H01L 29/41725* (2013.01); *H01L 29/41758* (2013.01); *H01L 29/66462* (2013.01); *H01L 29/7786* (2013.01)

(58) Field of Classification Search
CPC ............. H01L 29/475; H01L 21/28593; H01L 21/28581; H01L 29/205; H01L 29/41758
See application file for complete search history.

(56) References Cited

U.S. PATENT DOCUMENTS

| | | | | |
|---|---|---|---|---|
| 4,262,296 A | * | 4/1981 | Shealy ................ | H01L 29/1058 257/267 |
| 6,133,593 A | * | 10/2000 | Boos .................. | H01L 29/1029 257/194 |
| 9,331,154 B2 | * | 5/2016 | Chiu ................. | H01L 29/41758 |

(Continued)

*Primary Examiner* — Laura Menz
(74) *Attorney, Agent, or Firm* — Ding Yu Tan

(57) ABSTRACT

A heterostructure device includes a channel layer, a barrier layer disposed on the channel layer, and a first electrode and a second electrode disposed on the barrier layer, respectively. The second electrode includes a p-type semiconductor structure and a raised section disposed on the p-type semiconductor structure, the second electrode includes a Schottky contact and an ohmic contact, the Schottky contact is formed between a top surface of the p-type semiconductor structure and a first bottom surface of the raised section, the ohmic contact is formed between a second bottom surface of the raised section and the barrier layer.

20 Claims, 12 Drawing Sheets

(51) Int. Cl.
*H01L 21/285* (2006.01)
*H01L 29/205* (2006.01)

(56) References Cited

U.S. PATENT DOCUMENTS

| | | | |
|---|---|---|---|
| 9,356,128 B2* | 5/2016 | Lin | H01L 29/778 |
| 9,577,048 B1* | 2/2017 | Yang | H01L 29/66462 |
| 9,786,775 B2* | 10/2017 | Tu | H01L 29/7787 |
| 2014/0175517 A1* | 6/2014 | Cheng | H01L 29/36 |
| | | | 257/194 |
| 2014/0264326 A1* | 9/2014 | Lin | H01L 29/7783 |
| | | | 257/43 |
| 2015/0003039 A1* | 1/2015 | Liu | F21K 9/00 |
| | | | 362/84 |
| 2015/0048418 A1* | 2/2015 | Lin | H01L 29/778 |
| | | | 257/190 |
| 2015/0054034 A1* | 2/2015 | Chiu | H01L 29/41758 |
| | | | 257/194 |
| 2015/0137179 A1* | 5/2015 | Yang | H01L 29/66462 |
| | | | 257/190 |
| 2015/0340484 A1* | 11/2015 | Yang | H01L 29/7787 |
| | | | 257/43 |
| 2016/0233326 A1* | 8/2016 | Chiu | H01L 29/41758 |
| 2017/0117376 A1* | 4/2017 | Yang | H01L 29/66462 |
| 2017/0154987 A1* | 6/2017 | Tu | H01L 29/7787 |

* cited by examiner

HETEROSTRUCTURE DEVICE

REFERENCE TO RELATED APPLICATION

This application is a continuation application of U.S. patent application Ser. No. 14/864,680, filed on Sep. 24, 2015, now pending, and the content of which is hereby incorporated by reference in its entirety.

BACKGROUND OF THE INVENTION (a) Field of the Invention

The present invention is related to a heterostructure field effect transistor (HFET), and more particularly, to a group IIIA-VA HFET and method of fabricating the same.

(b) Description of the Prior Art

Today Schottky barrier diodes are used in many power switching applications such as switch mode power supplies (SMPS), converters, and inverters. Engineers and scientists have used heterostructure FET (HFET) or high-electron-mobility transistor (HEMT) to create Schottky barrier diodes. A heterostructure FET (HFET) or a high-electron-mobility transistor (HEMT) is a field-effect transistor (FET) incorporating a junction between two materials with different band gaps (i.e. a heterojunction) as the channel instead of a doped region as is the case generally for MOSFET. Most conventional power components are based on Si-based materials, because Si material is relatively inexpensive and is considered a well-understood material, but due to the limitations of the physical properties of the Si material, its role as a power component has reached a performance bottleneck in energy conversion efficiency. To this end, group IIIA-VA material has come to the forefront in the adaptation for usage as power device or in power switching applications.

At the moment, the device characteristics for group IIIA-VA have been recognized to be superior to other semiconductor materials, so as to be considered as viable candidate for used as power device up to a certain performance level, due to having a higher breakdown voltage, faster operating speed and lower operating resistance.

In many power device applications, it is desirable to improve forward OFF-state blocking performance and to have a reverse blocking capability. For power converters used in electric vehicles, the power switch must be protected from a reverse-battery connection, or from damage due to inadvertent biasing drain terminal and a negative bias voltage.

SUMMARY OF THE INVENTION

An object of the present invention is to provide a heterostructure device so that reverse blocking capability can also be achieved. The heterostructure device includes a channel layer, a barrier layer disposed on the channel layer, and a first electrode and a second electrode disposed on the barrier layer, respectively. The second electrode includes a p-type semiconductor structure and a raised section disposed on the p-type semiconductor structure, the second electrode includes a Schottky contact and an ohmic contact, the Schottky contact is formed between a top surface of the p-type semiconductor structure and a first bottom surface of the raised section, the ohmic contact is formed between a second bottom surface of the raised section and the barrier layer.

An object of the present invention is to provide a HFET using a p-type group IIIA-VA material for forming a depletion region, so that reverse blocking capability can also be achieved.

Another object of the present invention is to provide the p-type group IIIA-VA material to be grown adjacent to a drain contact, thereby forming the (selective) depletion region underneath the drain contact, and capable of using one single process to form a Schottky-ohmic drain contact.

Another object of the present invention is to provide a metal drain electrode to be contacting with a channel layer to form an ohmic contact, and to provide a p-type semiconductor patterned structure, such as, a P-GaN patterned structure or a p-AlGaN patterned structure formed by epitaxial growth or etching process as the p-type group IIIA-VA material, so that the P-GaN or p-AlGaN patterned structure is contacting with the metal drain electrode to form a Schottky contact. Together, a Schottky-ohmic drain contact is thereby achieved for the HFET device.

Another object of the present invention is to provide advantages over conventional HFET devices which include the following: providing capability of having just one single process to perform to form a Schottky-ohmic drain contact, thereby achieving cost reductions, using the p-type group IIIA-VA material for forming the depletion region, so that reverse blocking capability is achieved.

Another object is to provide methods of fabricating the heterostructure field effect transistor (HFET) of embodiments of present invention.

To achieve one or more of the objects, in one embodiment of present invention, a heterostructure field-effect transistor (HFET) including a first semiconductor layer disposed above a substrate, a second semiconductor layer disposed on the first semiconductor layer, a gate disposed on the second semiconductor layer, a channel layer including a first group IIIA-VA semiconductor material, a source electrode, and a drain electrode is provided. The first semiconductor layer can be a buffer layer made of group IIIA-VA semiconductor material, for example, aluminum nitride (AlN). The second semiconductor layer can be a barrier layer including a second group IIIA-VA semiconductor layer, for example, aluminum gallium nitride. The drain electrode includes a p-type semiconductor patterned structure and a raised drain section, in which the p-type semiconductor patterned structure can be p-type group IIIA-VA semiconductor patterned structure, such as a p-GaN patterned structure or a p-AlGaN patterned structure (also referred to as "p-GaN/p-AlGaN structure", or "p-GaN or p-AlGaN structure" herein), or a combined stacking structure of both a p-GaN patterned structure and a p-AlGaN patterned structure. The channel layer is formed on the first semiconductor layer. The second semiconductor layer is formed on the channel layer. The source electrode and the raised drain section are made of the same material, which can be metal. The drain electrode includes a Schottky contact and an ohmic contact, in which the Schottky contact is formed between a surface of the p-type semiconductor patterned structure (p-GaN/p-AlGaN structure) and a first surface of the raised drain section, the ohmic contact is formed between a second surface of the raised drain section and the barrier layer, the raised drain section is made of metal which can be, for example, gold, titanium, aluminum, and so on, and partially surrounding the p-type semiconductor patterned structure (p-GaN/p-AlGaN structure), and together with the p-type semiconductor patterned structure (p-GaN/p-AlGaN structure) to be forming an integral or integrated uniform structure disposed on the second semiconductor layer, a bandgap of the channel layer is less than a bandgap of the second semiconductor layer, and a depletion region is formed below the second semiconductor layer and underneath the p-type semiconductor patterned structure (p-GaN/p-AlGaN structure).

To achieve one or more of the objects, a first method for fabricating a HFET device includes the following steps: first, a buffer layer, a channel layer, and a barrier layer are respectively grown by metal organic chemical-vapor deposition (MOCVD) on a substrate in sequential order; second, a dielectric film layer is formed and patterned on the AlGaN barrier layer to serve as a regrowth mask; third, using the patterned dielectric (SiN) film layer as regrowth mask, a p-GaN patterned structure or a p-AlGaN patterned structure is grown on the barrier layer by MOCVD; fourth, the source and drain contacts/electrodes, comprising of a same material, are formed at the same time, with the source ohmic contact formed on the barrier layer, the drain Schottky contact formed on the p-GaN/p-AlGaN patterned structure and the drain ohmic contact formed on the barrier layer, respectively; fifth, a Schottky gate is formed on the barrier layer to form the HFET device of the embodiment of present invention.

To achieve one or more of the objects, in addition, a second method for fabricating a HFET device of the embodiment of present invention including the following steps is provided: first, a buffer layer, a channel layer, a barrier layer, and a p-GaN layer or a p-AlGaN layer are respectively grown by metal organic chemical-vapor deposition (MOCVD) on a substrate in sequential order; second, a mask layer is formed and patterned by etching thereof on the p-GaN layer or the p-AlGaN layer; third, using the patterned mask layer, a p-GaN patterned structure or a p-AlGaN patterned structure is formed by dry-etching the p-GaN layer or the p-AlGaN layer by inductively coupled plasma (ICP) on the barrier layer; fourth, the source and drain contacts/electrodes, comprising of a same material, are formed at the same time, with the source ohmic contact formed on the barrier layer, the drain Schottky contact formed on the p-GaN/p-AlGaN patterned structure and the drain ohmic contact formed on the AlGaN barrier layer, respectively; fifth, a Schottky gate is formed on the AlGaN barrier layer to form the HFET device. The HFET fabricated by each of the above fabrication methods possesses improved forward OFF-state blocking performance and a reverse blocking capability, and better protected from a reverse-battery connection, such as when used as a power switch in electric vehicles, or from damage due to inadvertent biasing drain terminal and a negative bias voltage so as to achieve better device longevity. Meanwhile, the Schottky-ohmic drain for the HFET is fabricated using one processing step so as to lower fabrication cost without sacrificing forward OFF-state blocking performance.

To achieve one or more of the objects, in one embodiment of present invention, a p-type group IIIA-VA material is selected for use as the material for the depletion region, so that reverse blocking capability is also achieved.

To achieve one or more of the objects, in one embodiment of present invention, activating the body diode may lead to transient punch-through situation, for example, when it is restored at high dv/dt, the displacement current in the Miller capacitance would provide current charge for the gate, and can reach more than turn-on voltage ($V_{TH}$), while complementary MOSFET is trying to be conducting, can cause a transient short circuit to the bus voltage, and creating increased power dissipation and MOSFET failure. To avoid this phenomenon, silicon carbide (SiC) or conventional silicon diode can be added on the outside of the HFET, and to be parallel-connected in reverse to a MOSFET.

Advantages of present invention include the following: having capability of performing just one single process to form a Schottky-ohmic drain contact, thereby achieving cost reduction, using the p-type group IIIA-VA material for forming the depletion region, so reverse blocking capability is also achieved.

To achieve one or more of the objects, in the embodiments of present invention, the p-type group IIIA-VA material is grown adjacent to the drain contact/electrode, thereby forming a (selective) depletion region, and then a single process is used to form a Schottky-ohmic drain contact/electrode. Typically a metal together with the channel layer form an ohmic contact, while with p-type group IIIA-VA material would form a Schottky contact, which is found also for the Schottky-ohmic drain contact/electrode of embodiments of present invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention is illustrated by way of example and not limited by the figures of the accompanying drawings in which same references indicate similar elements. Many aspects of the disclosure can be better understood with reference to the following drawings. Moreover, in the drawings same reference numerals designate corresponding elements throughout. Wherever possible, the same reference numerals are used throughout the drawings to refer to the same or similar elements of an embodiment.

FIGS. 1-3A, 4A-4C, and 5A are cross-sectional views illustrating a first method for fabricating a HFET device according to an embodiment of present invention.

FIGS. 14A, 14B and 14C show operation mechanisms for the HFET device of present invention, in which FIG. 14A shows an off-state for the HFET, FIG. 14B shows reverse blocking capability at reverse drain bias condition, and FIG. 14C shows HFET at large forward bias condition.

DETAILED DESCRIPTION OF THE PREFERRED EMBODIMENTS

The present invention will now be described more specifically with reference to the following embodiments. It is to be noted that the following descriptions of the embodiments of this invention are presented herein for purpose of illustration and description only. It is not intended to be exhaustive or to be limited to the precise form disclosed.

Figure 1:
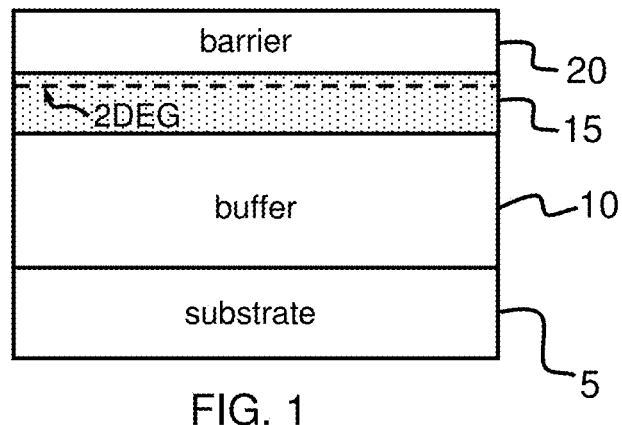
Figure 2:
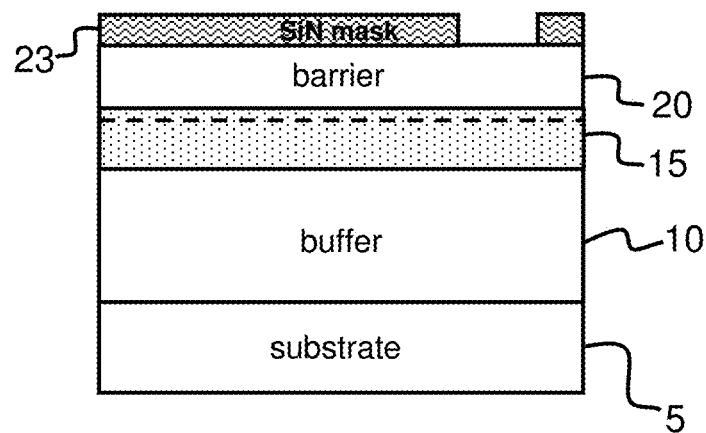

Referring to FIGS. 1-5, a first method for fabricating a heterostructure field effect transistor (HFET) device 100 according to an embodiment of present invention includes the following steps: in a first step, a buffer layer 10, a channel layer 15 including a first group IIIA-VA semiconductor material, and an barrier layer 20 including a first group IIIA-VA semiconductor material are respectively epitaxially grown by metal organic chemical-vapor deposition (MOCVD), hydride vapor phase epitaxy (HVPE), liquid phase epitaxy (LPE), and so forth on a substrate 5 in sequential order as shown in FIG. 1. A two-dimensional electron gas (2DEG), indicated by the dash lines in FIG. 1, is formed in the channel layer 15 near an interface of the channel layer 15 and the barrier layer 20. In a second step, a dielectric film 23, for example, SiN film layer 23, is formed and patterned on the barrier layer 20 to as a regrowth mask as shown in FIG. 2. In a third step, using the patterned dielectric film layer 23 as a regrowth mask, a p-type patterned structure 30, for example, a p-GaN patterned structure or a p-AlGaN patterned structure, is grown on the barrier layer 20 by MOCVD, HVPE, LPE, and so forth as shown in FIG. 3A. In one embodiment, a shape of the p-type patterned structure 30 in a top view includes a continuous strip with width $w_{p1}$ as shown in FIG. 3B. In another one embodiment, a shape of a p-type patterned structure 30, disposed on a barrier layer 20, in a top view can be a plurality of strips with width $w_{p2}$ disposed at intervals d<100 nm as shown in FIG. 3C. In a fourth step, a source contact/electrode 35 and a raised drain section 42, including of a same material, which can be metal, are deposited and formed at the same time, with a source ohmic contact 41 formed on the barrier layer 20, a drain Schottky contact 44 formed between the raised drain section 42 and the p-type patterned structure 30, and a drain ohmic contact 46 formed between the raised drain section 42 and the barrier layer 20, respectively, at the same time with the same metal as shown in FIGS. 4A-4C. Specifically, as shown in the enlarged partial cross-sectional views of FIGS. 4B and 4C, the drain Schottky contact 44 is formed between a top surface 30a together with or combined with a side surface 30b of the p-type patterned structure 30 and a first bottom surface 42a together with or combined with a side surface 42b of the raised drain section 42. The top surface 30a is directly contacting the first bottom surface 42a. Additionally, the drain ohmic contact 46 is formed between a second bottom surface 42c of the raised drain section 42 and the barrier layer 20. In a fifth step, a Schottky gate 50 can be, for example, platinum, tungsten, titanium, molybdenum, or any of their compounds and is formed on the barrier layer 20 to arrive at the device 100 as shown in FIGS. 5A-5B. Herein, materials of the channel layer 15 and the barrier layer 20 may include $In_{y1}Al_{z1}Ga_{(1-y1-z1)}N$, $In_{y2}Al_{z2}Ga_{(1-y2-z2)}P$, $In_{y3}Al_{z3}Ga_{(1-y3-z3)}As$, where $0 \leq y1, y2, y3 \leq 1$, $0 \leq z1, z2, z3 \leq 1$, and $0 \leq (1-y1-z1), (1-y2-z2), (1-y3-z3) \leq 1$, however the application is not limited hereto. Indeed, the channel layer 15 has a narrower band gap than that of the barrier layer 20.

Figure 6:
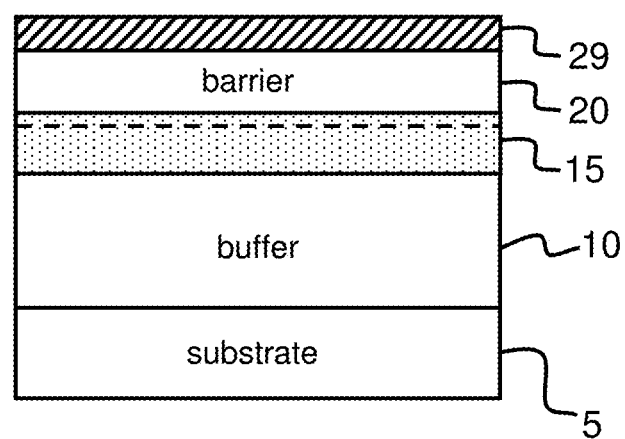
FIGS. 6-8, 9A-9C, and 10 are cross-sectional views illustrating a second method for fabricating a HFET device according to an embodiment of present invention.
Figure 7:
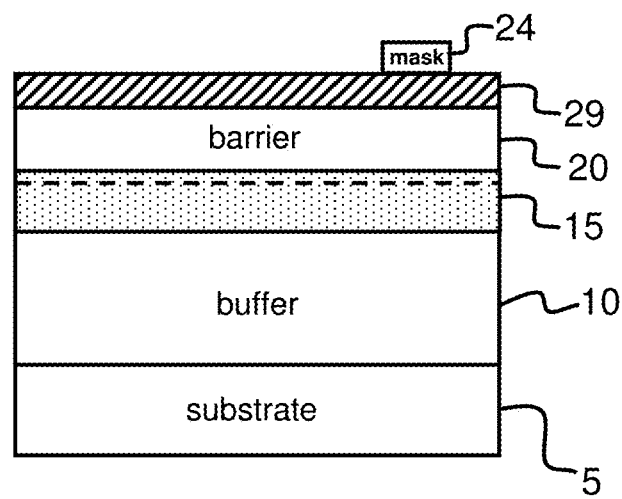
Figure 8:
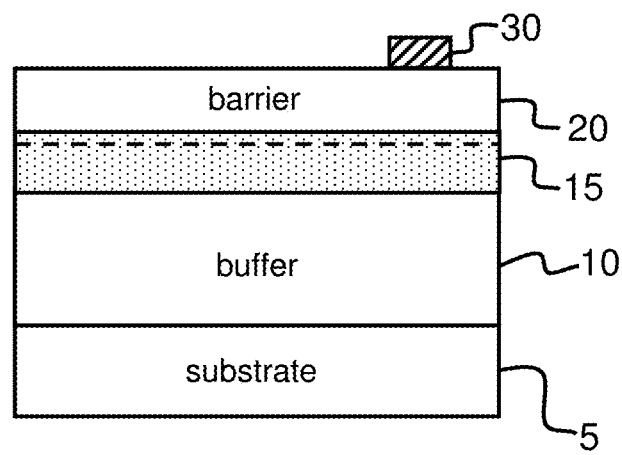
Figure 9A:
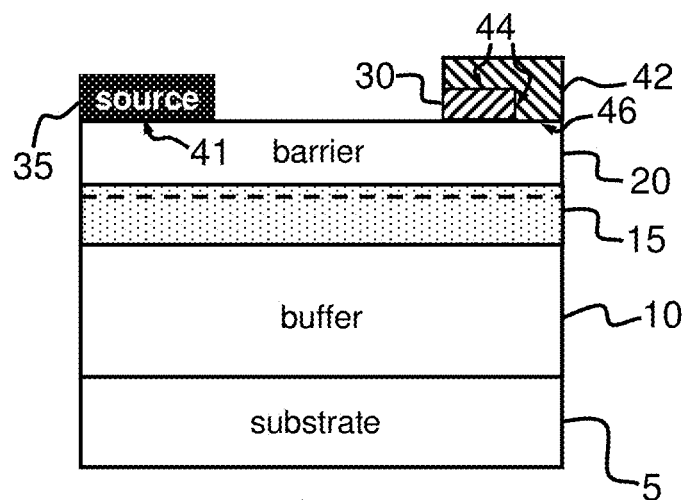
Figure 9B:
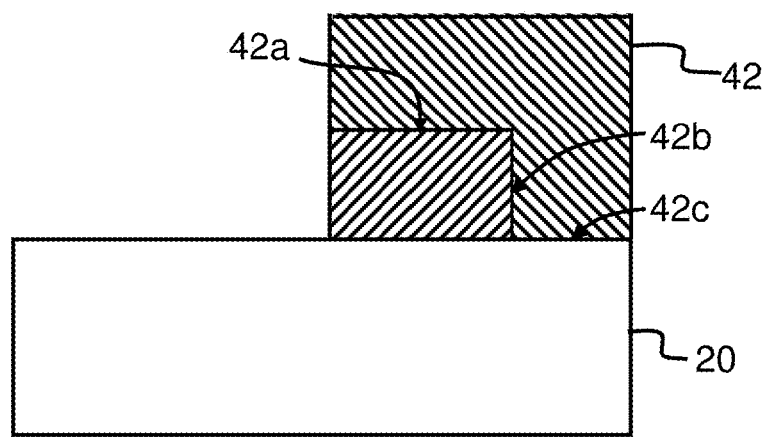
Figure 9C:
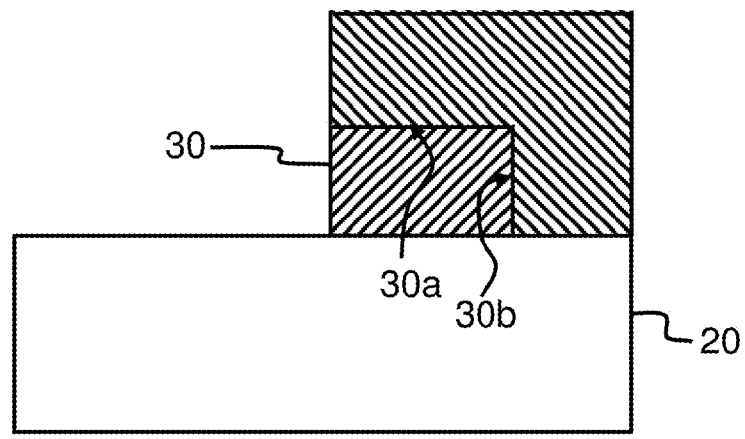
Figure 10:
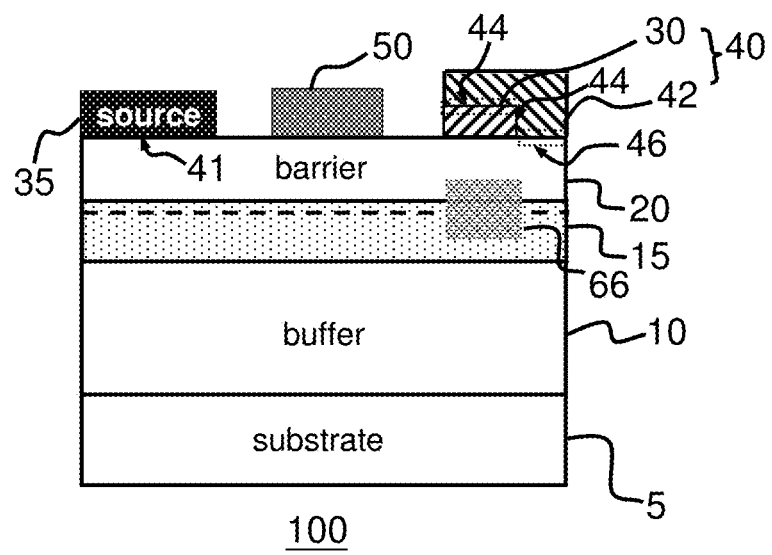

Referring to FIGS. 6-10, a second method for fabricating the HFET device 100 according to the present invention includes the following steps: in a first step, a buffer layer 10, a channel layer 15, a barrier layer 20, and a p-type layer 29, for example, p-GaN layer or a p-AlGaN layer, re spectively grown by metal organic chemical-vapor deposition (MOCVD) on a substrate 5 in sequential order as shown in FIG. 6. In a second step, a mask layer 24 that may be made of SiO$_2$ is formed and patterned by etching the mask layer 24 formed on the p-type layer 29 as shown in FIG. 7. In a third step, using the patterned mask layer 24, a p-type patterned structure 30 is formed by dry-etching the p-type layer 29 by inductively coupled plasma (ICP) on the barrier layer 20 as shown in FIG. 8. In a fourth step, a source contact 35 and a raised drain section 42, comprising of a same material, which can be metal, are deposited and formed at the same time, with the source ohmic contact 41 formed between the source contact 35 and the barrier layer 20, the drain Schottky contact 44 formed between the raised drain section 42 and the p-type patterned structure 30 while the drain ohmic contact 46 formed between the raised drain section 42 and the barrier layer 20, respectively, at the same time with the same metal as shown in FIG. 9. In a fifth step, a Schottky gate 50 is formed on the barrier layer 20 to arrive at the fabricated HFET device 100 as shown in FIG. 10.

In the fourth steps of the above-described fabrication methods for the HFET device 100 as shown in FIGS. 4A-4C and FIG. 9, the deposition method of the metal source contact/electrode 35 and the drain contact/electrode 40 is conducted or performed using a single metal crystal, in which the single metal crystal and a p-type patterned structure 30 (p-GaN patterned structure or the p-AlGaN patterned structure) form a Schottky metal-semiconductor contact 44, which is also referred to as the drain Schottky contact 44 herein; the single metal crystal and the barrier layer 20 form an ohmic metal-semiconductor contact 46, which is also referred to as the drain ohmic contact 46 herein.

Figure 3A:
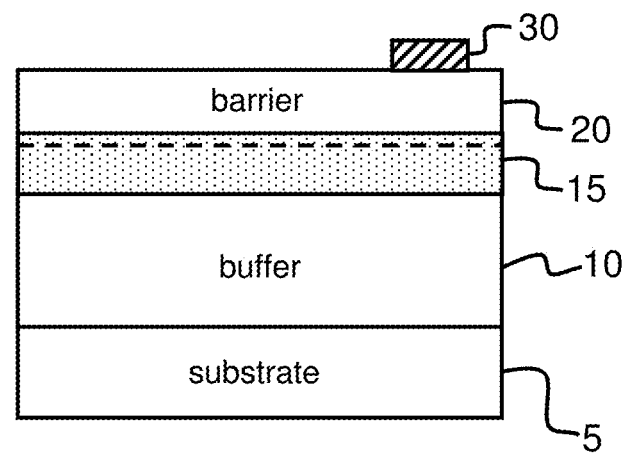
Figure 3B:
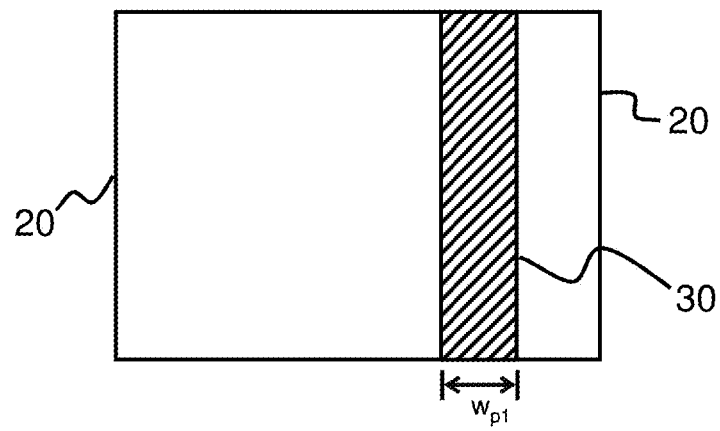
FIGS. 3B, 5B are top views illustrating the first method for fabricating a HFET device according to the embodiment of present invention.
Figure 3C:
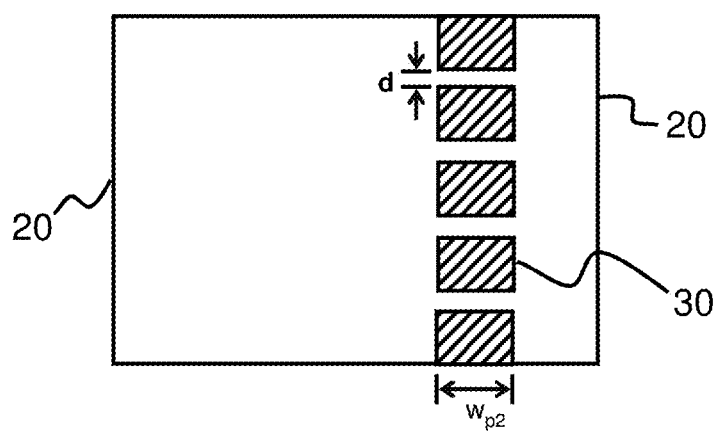
FIGS. 3C is a top view illustrating the first method for fabricating a HFET device according to another embodiment of present invention.
Figure 4A:
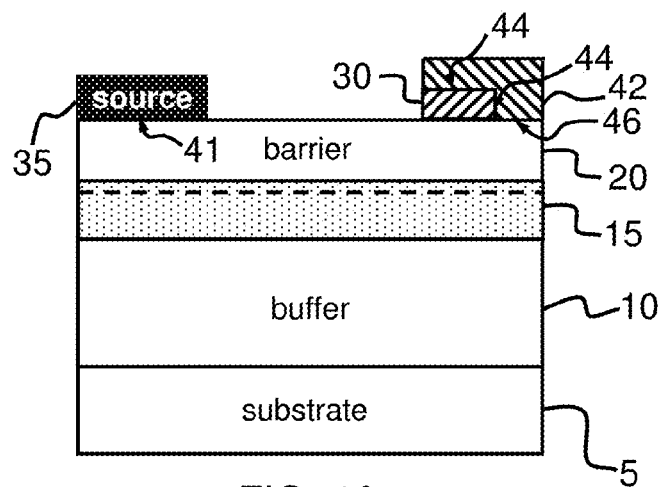
Figure 4B:
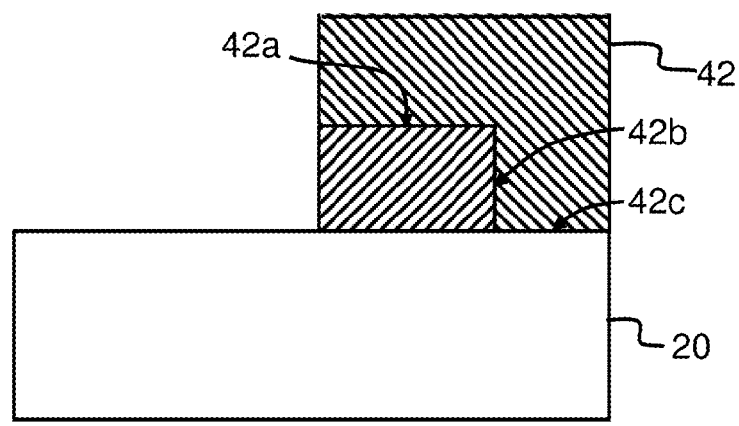
Figure 4C:
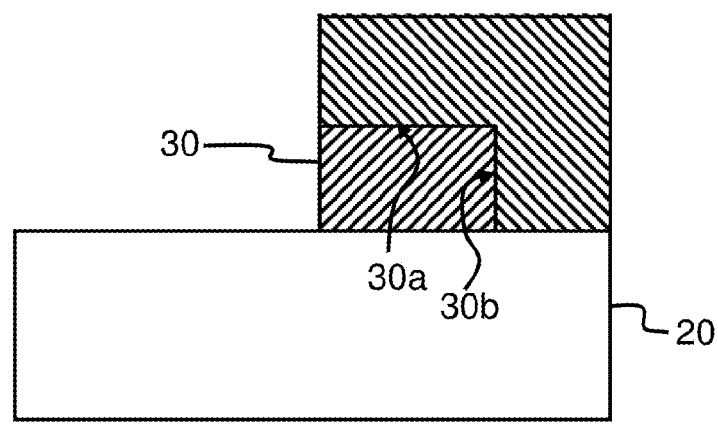
Figure 5A:
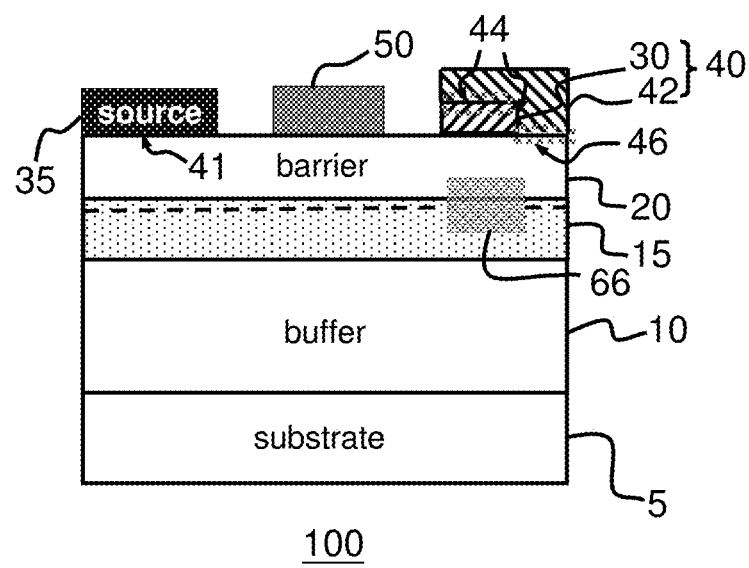
Figure 5B:
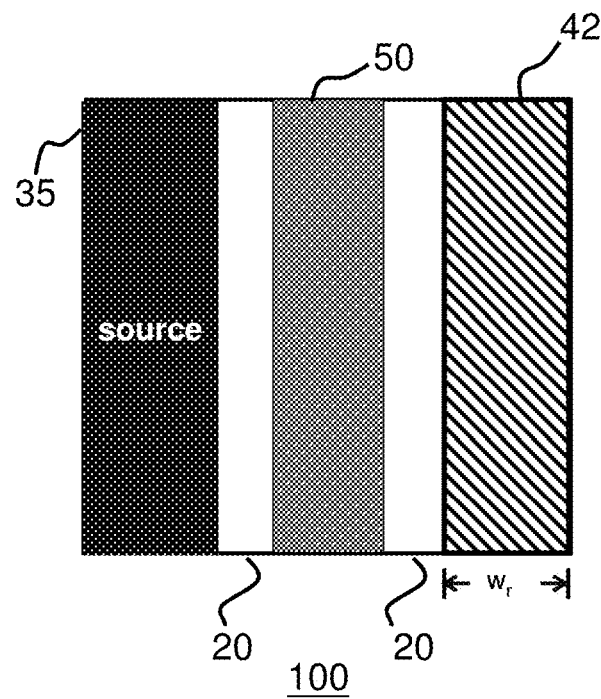
Figure 11:
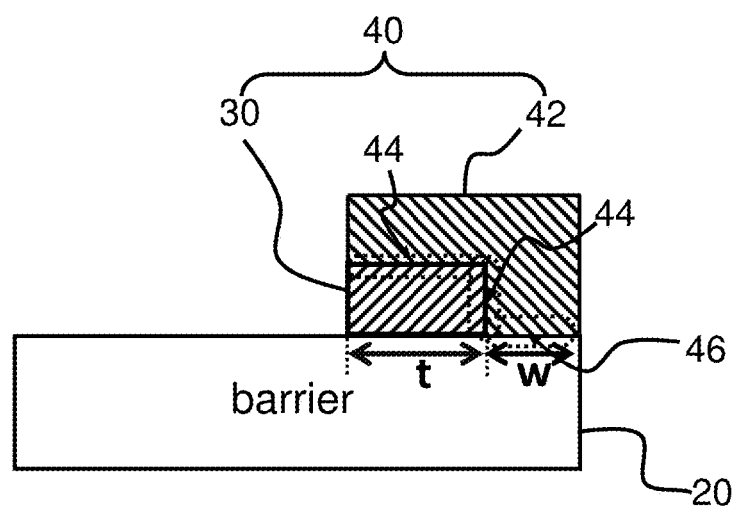
FIG. 11 is an enlarged partial view of a drain electrode/contact showing a contact width t of the p-type semiconductor patterned structure and a contact width w of the raised drain section of the HFET device of the embodiment of present invention.
Figure 12:
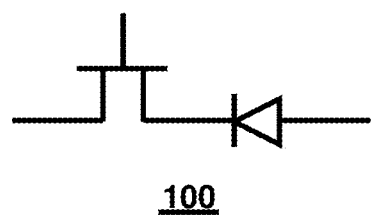
FIG. 12 is an equivalent circuit schematic for the HFET device of present invention.
Figure 13:
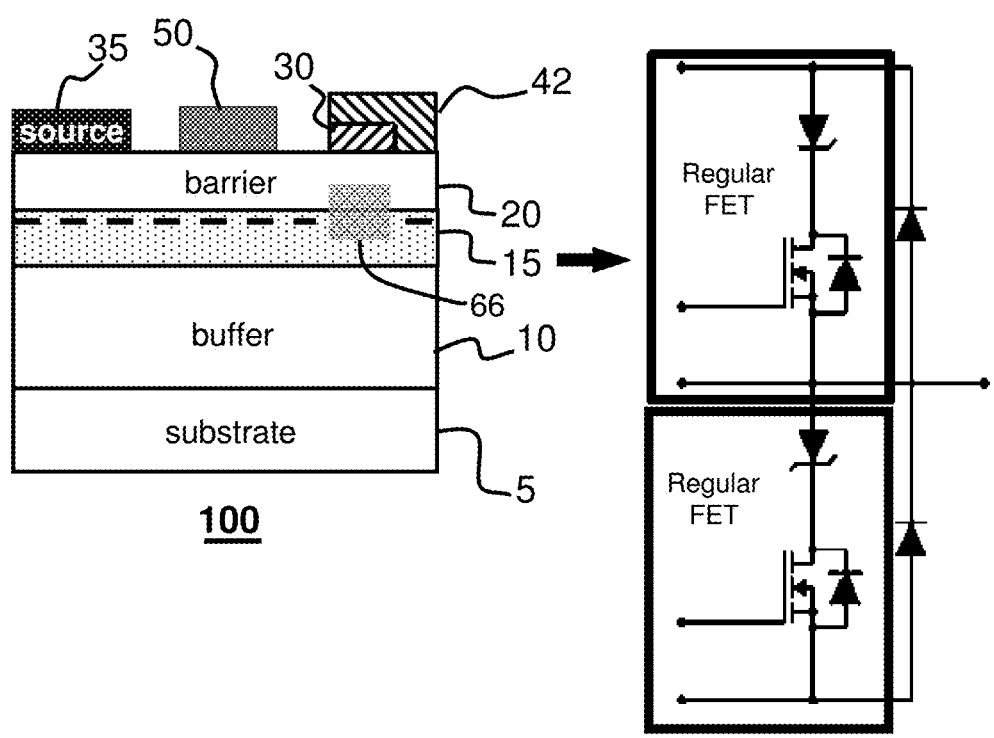
FIG. 13 shows the HFET of the illustrated embodiment of present invention replacing conventional diodes which are reversely serially connected in parallel.

Referring to FIGS. 5A-5B and 10, the heterostructure field-effect transistor (HFET) 100 of the embodiment of present invention as fabricated by each of the above fabrication methods is shown in cross-sectional views thereof. The HFET 100 including the buffer layer 10 disposed above the substrate 5, the channel layer 15 disposed on the buffer layer 10, the barrier layer 20 disposed on the channel layer 15, the Schottky gate 50 disposed on the barrier layer 20, the source contact/electrode 35, and the drain contact/electrode 40 is shown in the illustrated embodiment. The drain contact/ electrode 40 includes the p-type semiconductor patterned structure 30 and the raised drain section 42, in which the p-type semiconductor patterned structure 30 is, for example, a p-GaN patterned structure or a p-AlGaN patterned structure (also referred to as "p-GaN/p-AlGaN structure" or "p-GaN or p-AlGaN structure" herein) or a combined stacking layers of both p-GaN patterned structure and p-AlGaN patterned structure. A shape of the raised drain section 42 in a top view is a strip as shown in FIG. 5B and has a width $w_r$ wider than the width $w_{p1}$ or $w_{p2}$ of the shape of p-type patterned structure 30 in a top view as shown in FIG. 3B and FIG. 3C. The raised drain section 42 covers the p-type patterned structure 30 in a top view. The source electrode 35 and the raised drain section 42 are made of the same material, which can be metal, such as, for example, titanium, copper, silver, tungsten, aluminum, gold, or any of their compounds. The drain contact/electrode 40 includes the drain Schottky contact 44 and the drain ohmic contact 46, in which the drain Schottky contact 44 is formed between the top surface 30a together with or combined with the side surface 30b of the p-type semiconductor patterned structure 30 and the first bottom surface 42a together with or combined with the side surface 42b of the raised drain section 42, and the top surface 30a together with or combined with the side surface 30b of the p-type semiconductor patterned structure 30 is directly contacting the first bottom surface 42a together with or combined with the side surface 42b of the raised drain section 42, the drain ohmic contact 46 is formed between a second bottom surface 42c of the raised drain section 42 and the barrier layer 20, the raised drain section 42 is made of metal which includes gold, titanium, aluminum, and so on, partially surrounding the p-type semiconductor patterned structure 30, and together with the p-type semiconductor patterned structure 30 (p-GaN/p-AlGaN structure) form an integral or integrated uniform structure as being the drain contact/electrode 40 disposed on the barrier layer 20, and a depletion region 66 is formed below the barrier layer 20, to be disposed within the channel layer 15, and underneath the p-type semiconductor patterned structure 30. As illustrated in FIG. 11, a contact width t of the p-type semiconductor patterned structure 30 is larger than a contact width w of the raised drain section 42 in an enlarged partial view of the drain electrode/contact 40 of the HFET 100 of embodiment of present invention. Referring to FIG. 12, an equivalent circuit schematic for the HFET device 100 of present invention is shown. Furthermore, referring to FIG. 13, an example of the semiconductor device structure of a HFET 100 of the illustrated embodiment for replacing one or more conventional diodes (rectangle frame) which are reversely serially connected in parallel is shown.

In various embodiments of the present invention, the substrate 5 can be made of GaAs, AlGaAs, GaAsP, GaP, Si, SiC, metals, sapphire, GaN, AlN, ZnO, MgO, glass, or the like. Herein, materials of the channel layer 15 and the barrier layer 20 may include $In_{y1}Al_{z1}Ga_{(1-y1-z1)}N$, $In_{y2}Al_{z2}Ga_{(1-y2-z2)}P$, or $In_{y3}Al_{z3}Ga_{(1-y3-z3)}$, as where $0 \leq y1, y2, y3 \leq 1$, $0 \leq z1, z2, z3, z4 \leq 1$, and $0 \leq (1-y1-z1), (1-y2-z2), (1-y3-z3) \leq 1$, but the application is not limited hereto. Indeed, the channel layer 15 has a narrower band gap than that of the barrier layer 20. The dielectric film layer 23 can be made of silicon nitride (SiN). The buffer layer 10 can be made of aluminum nitride (AlN) or Indium aluminum nitride (InAlN).

Figure 14A:
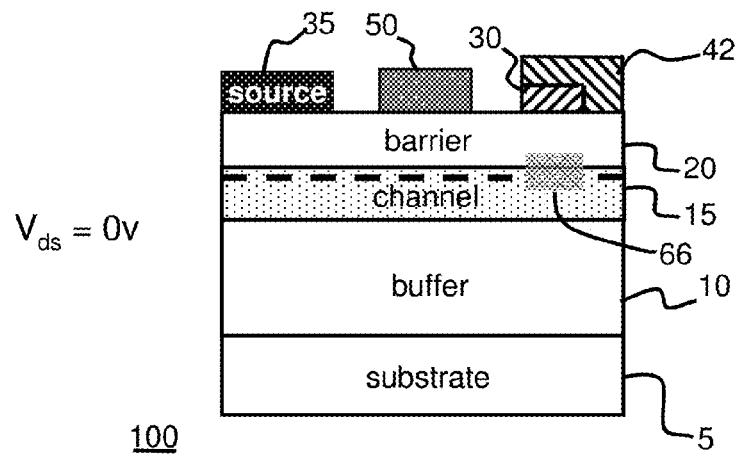
Figure 14B:
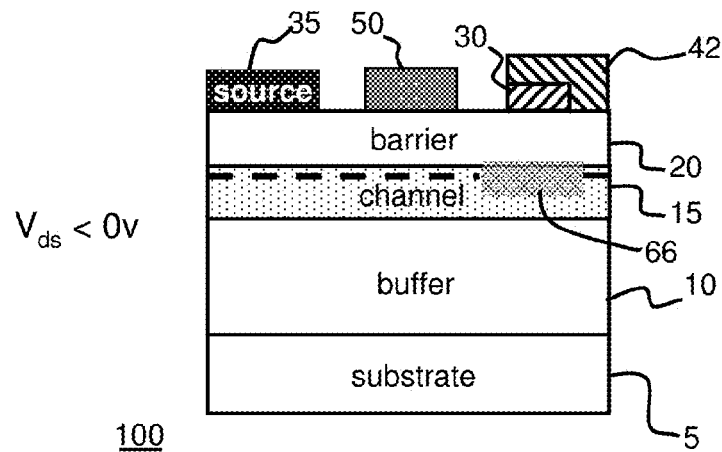
Figure 14C:
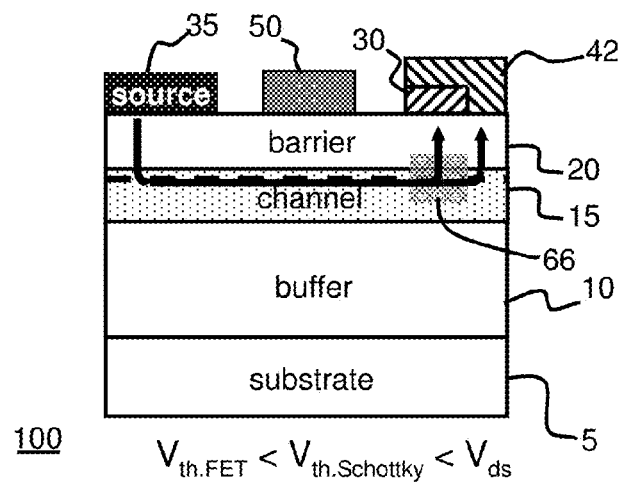

Operation mechanisms for the HFET device 100 are illustrated respectively in FIGS. 14A, 14B, and 14C. FIG. 14A shows an off-state for the HFET 100, and the drain-source voltage ($V_{ds}$) is 0 V at zero drain bias state. FIG. 14B shows reverse blocking capability with the enlarged depletion region for the HFET 100, in which $V_{ds}$ has negative voltage ($V_{ds} < 0$ V) at reverse drain bias condition. FIG. 14C shows drain-source current traveling through the GaN channel when $V_{ds} > 0$ and $V_{ds} > V_{th.\ Schottky} > V_{th.\ FET}$ (which is at large forward bias condition), in which $V_{th.\ Schottky}$ is the turn-on voltage for the Schottky diode, and $V_{th.\ FET}$ is the turn-on voltage of the HFET 100.

Figure 15:
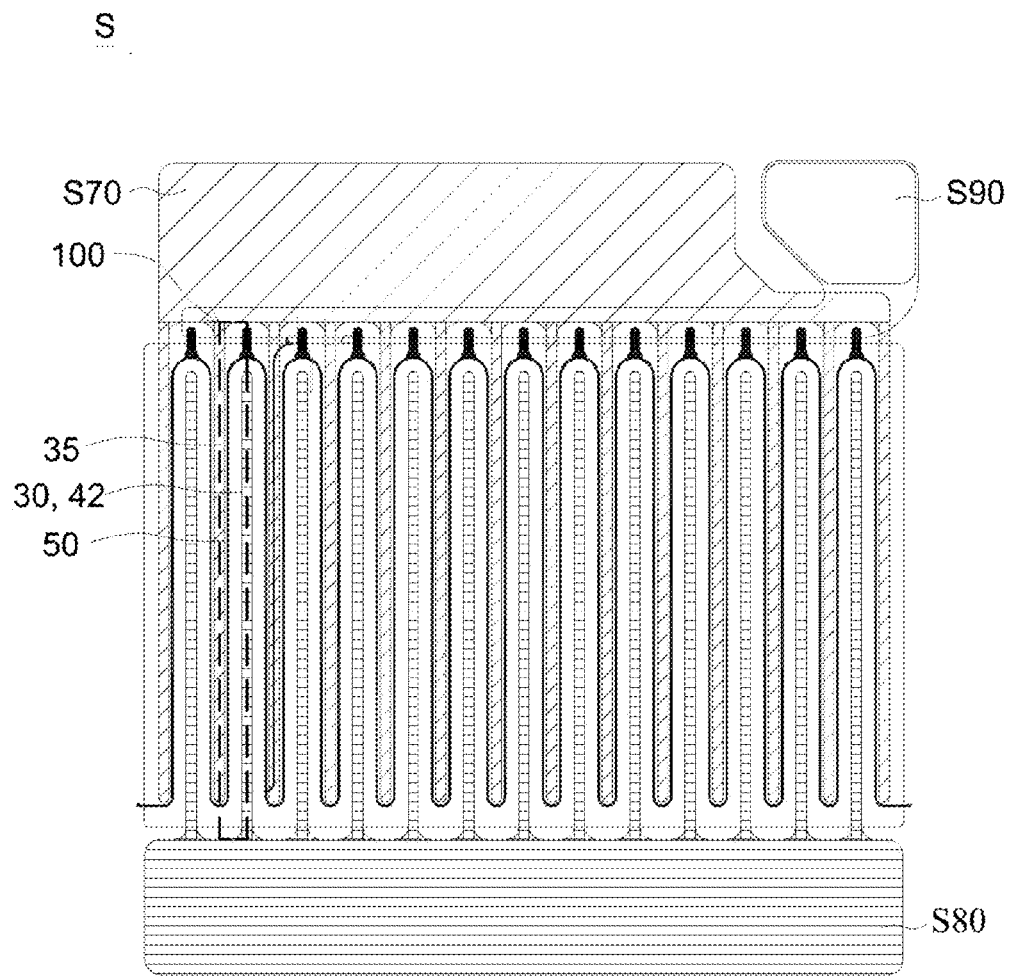
FIG. 15 shows a top view of a semiconductor power device having three terminals and including at least one HFET device in accordance with the embodiments of present invention.

Referring to FIG. 15, a top view of a semiconductor power device S is shown, in which the semiconductor power device S has three terminals. In the present embodiment, the semiconductor power device S has a source pad S70, a drain pad S80, and a gate pad S90, and includes at least one HFET device (or HEMT device) 100 in accordance with the embodiments of present invention. The source contact/electrode 35 of the HFET device 100 is electrically connected to the source pad S70, the drain contact/electrode 40 (the p-type patterned structure 30 and the raised drain section 42 together form the drain contact electrode 40) is electrically connected to drain pad S80, the Schottky gate 50 is electrically connected to the gate pad S90. In addition, the HFET device (or HEMT device) 100 of the semiconductor power device S can be replaced by other types semiconductor devices in alternative embodiments, but would still be without departing from the spirit and scope of the embodiments or sacrificing all of its material advantages.

According to the embodiments of present invention, a HFET device is fabricated having a drain contact/electrode, a p-type semiconductor patterned structure, which can be a p-GaN patterned structure or a p-AlGaN patterned structure disposed below the drain contact/electrode, wherein the p-type semiconductor patterned structure is formed by epitaxial growth or etching process. Meanwhile, the p-type semiconductor patterned structure is configured to enable the p-type group IIIA-VA material (AlGaN/GaN) epitaxial layers disposed therebelow to form a depletion region. The HFET device has a drain contact/electrode which is deposited above the p-type semiconductor patterned structure and above the p-type group IIIA-VA material epitaxial layer directly at the same time.

According to the embodiments of present invention for the heterostructure device, the first electrode is a source electrode 35, the second electrode is a drain electrode 40, and the third electrode is a gate electrode; the raised drain section 42 is an example of a raised section, the p-type semiconductor patterned structure 30 is a p-type semiconductor structure; the third electrode can also be the Schottky gate 50.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A heterostructure device, comprising:
a substrate;
a buffer layer disposed on the substrate;
a channel layer disposed on the buffer layer;
a barrier layer disposed on the channel layer;
a first electrode; and
a second electrode,
wherein the second electrode includes a p-type semiconductor structure and a raised section disposed on the p-type semiconductor structure, the second electrode includes a Schottky contact and an ohmic contact, the Schottky contact is formed between a top surface of the p-type semiconductor structure and a first bottom surface of the raised section, the ohmic contact is formed between a second bottom surface of the raised section and the barrier layer.

2. The heterostructure device as claimed in claim 1, wherein a depletion region is formed within the channel layer and the barrier layer and underneath the p-type semiconductor structure.

3. The heterostructure device as claimed in claim 1, wherein a two-dimensional electron gas forms within the channel layer and is devoid of forming in the depletion region.

4. The heterostructure device as claimed in claim 1, wherein the raised section covers the top surface of the p-type semiconductor structure.

5. The heterostructure device as claimed in claim 1, wherein the Schottky contact is formed between a side surface of the p-type semiconductor structure and a side surface of the raised section.

6. The heterostructure device as claimed in claim 1, wherein the p-type semiconductor structure is a p-GaN patterned structure, a p-AlGaN patterned structure, or a combined stacking layers of the p-GaN patterned structure and the p-AlGaN patterned structure.

7. The heterostructure device as claimed in claim 1, wherein in a cross-sectional view, a contact width between the p-type semiconductor structure and the barrier layer is larger than a contact width between the raised section and the barrier layer.

8. The heterostructure device as claimed in claim 1, wherein the raised section together with the p-type semiconductor structure form an integral structure disposed on the barrier layer.

9. The heterostructure device as claimed in claim 1, wherein the substrate is made of at least one material selected from the group consisting of GaAs, AlGaAs, GaAsP, GaP, Si, SiC, metals, sapphire, GaN, AlN, ZnO, MgO, and glass.

10. The heterostructure device as claimed in claim 1, wherein the channel layer is made of $In_{y1}Al_{z1}Ga_{(1-y1-z1)}N$ epitaxial layer, the barrier layer is made of $In_{y2}Al_{z2}Ga_{(1-y2-z2)}N$ epitaxial layer, where 0≤y1, y2≤1, 0≤z1, z2≤1, and 0≤(1-y1-z1), (1-y2-z2)<1.

11. The heterostructure device as claimed in claim 1, wherein the first bottom surface of the raised section is directly contacting the top surface of the p-type semiconductor structure, the second bottom surface of the raised section is directly contacting a top surface of the barrier layer, and a side surface of the p-type semiconductor structure is directly contacting a side surface of the raised section.

12. The heterostructure device as claimed in claim 1, further comprising a third electrode between the first electrode and the second electrode.

13. The heterostructure device as claimed in claim 1, wherein the raised drain section is partially surrounding the p-type semiconductor structure, and a bandgap of the channel layer is less than a bandgap of the barrier layer.

14. The heterostructure device as claimed in claim 12, wherein the first electrode is a source electrode, the second electrode is a drain electrode, and the third electrode is a gate electrode.

15. The heterostructure device as claimed in claim 1, wherein in a cross-sectional view, a width of the first bottom surface of the raised section is greater than a width of the second bottom surface of the raised section.

16. The heterostructure device as claimed in claim 1, wherein a shape of the p-type structure in a top view comprises a continuous strip.

17. The heterostructure device as claimed in claim 1, wherein a shape of the p-type structure in a top view comprises a plurality of strips disposed at intervals.

18. The heterostructure device as claimed in claim 1, wherein the first electrode and the raised section comprises a same material.

19. The heterostructure device as claimed in claim 18, wherein the first electrode and the raised section, being of the same material, comprises a metal.

20. The heterostructure device as claimed in claim 1, wherein the channel layer comprises a first group IIIA-VA compound semiconductor material and the barrier layer comprises a second group IIIA-VA compound semiconductor material.

* * * * *